US006192505B1

(12) United States Patent
Beer et al.

(10) Patent No.: US 6,192,505 B1
(45) Date of Patent: Feb. 20, 2001

(54) METHOD AND SYSTEM FOR REDUCING STATE SPACE VARIABLES PRIOR TO SYMBOLIC MODEL CHECKING

(75) Inventors: Ilan Beer, Haifa; Cindy Eisner, Zichron Yaakov; Yoav Rodeh, Moshav Ben-Ami, all of (IL)

(73) Assignee: International Business Machines Corporation, Armonk, NY (US)

( * ) Notice: Under 35 U.S.C. 154(b), the term of this patent shall be extended for 0 days.

(21) Appl. No.: 09/124,360

(22) Filed: Jul. 29, 1998

(51) Int. Cl.[7] ........................................... G06F 17/50
(52) U.S. Cl. ................... 716/2; 716/4; 703/14; 714/724
(58) Field of Search .................. 395/500.03, 500.05, 395/500.23, 500.35; 714/724, 737, 738, 739, 741; 703/2, 14; 716/2, 4

(56) References Cited

U.S. PATENT DOCUMENTS 5,566,187 * 10/1996 Abramovici et al. ................. 714/724
5,657,240 * 8/1997 Chakradhar et al. ............ 395/500.05
5,761,487 * 6/1998 Yuguchi ............................ 395/500.03

OTHER PUBLICATIONS

Cheng, "On Removing Redundancy in Sequential Circuits", Proceedings of the 28 ACM/IEEE Design Automation Conference, pp. 164–169, 1991.*

Ashar et al, "Irredundant Interacting Sequential Machines Via Optimal Logic Synthesis", IEEE Transactions on Computer–Aided Design of Integrated Circuits and Systems, pp. 311–325, 1991.*

Baumgartner et al, "An Overview and Application of Model Reduction Techniques in Formal Verification", IEEE International Performance, Computing, and Communications, pp. 165–171, Feb. 1998.*

Dordick, "A Chip Verification On a Large Scale", IBM Research Magazine, Issue 2, 1996, found at: http://www.research.ibm.com/resources/magazine/1996/issue_2/verify296.html.*

* cited by examiner

Primary Examiner—Kevin J. Teska
Assistant Examiner—Samuel Broda
(74) Attorney, Agent, or Firm—Browdy and Neimark

(57) ABSTRACT

A computer-implemented method for systematically eliminating redundant circuit elements in a state machine of a model having sequential circuit elements possessing one of a fixed number of possible states, typically "0" and "1". Initially, the sequential circuit elements are sorted into groups whose state is determinate i.e. equal to "0" or "1". The state of each circuit element whose state is determinate is stored in memory and its next state is calculated and compared with its preceding state. Each circuit element whose successive states are different is moved to the group of indeterminate circuit elements, and the cycle is repeated in respect of all remaining determinate circuit elements until no further circuit elements are moved. Each of the remaining determinate circuit elements is then replaced by a constant equal to its corresponding state i.e. "0" or "1". Finally, any circuit elements whose output is connected to one or more of the replaced circuit elements and to no other circuit elements is eliminated from the model.

3 Claims, 3 Drawing Sheets

METHOD AND SYSTEM FOR REDUCING STATE SPACE VARIABLES PRIOR TO SYMBOLIC MODEL CHECKING

FIELD OF THE INVENTION

This invention relates in general to model checking and, in particular, to model reduction techniques prior to computer-implemented model checking.

BACKGROUND OF THE INVENTION

When designing integrated circuits including combinatorial and sequential gates and circuit elements, tools are used to check the integrity of the final design before proceeding to mass-production. The tools are computer programs which require as input a mathematical model of the integrated circuit design and a specification of desired design criteria. Thus, for example, a Flip-Flop circuit element may generate an acknowledge signal (ACK) responsive to a request signal (REQ) and the design specification may require that the REQ signal produces the ACK signal within three clock cycles.

From knowledge of the design specification and the mathematical model of the integrated circuit, the computer determines whether the model meets the specified design criteria. Such a program solves a state machine having a large number of variables dependent, of course, on the model complexity. Thus, the more gates and memory elements in the integrated circuit, the more complex is the model and the greater the number of variables in the state machine to be solved. In practice, the more complex the design the greater is the size of memory which the computer requires to solve the state machine; and the longer the calculation time. There exists, therefore, a need to reduce the model complexity without compromising on the integrity of the model checking.

Prior art techniques relate principally to manual and/or trivial reduction of the number of state variables by eliminating obviously redundant circuit elements. For example, FIG. 1 shows part of a logic circuit depicted generally as 10 comprising an AND-gate 11 whose output is fed to the REQ input of a Flip-Flop 12 having an ACK output 13 and a CLK input 14. A first input 15 of the AND-gate 11 is driven by the output of a sub-circuit designated 16 which may itself include a large number of logic elements. A second input 17 of the AND-gate 11 is tied to logic "0".

In such an arrangement, the output of the AND-gate 11 will always be logic "0" regardless of any changes that occur in the logic state of the first input 15 of the AND-gate 11 consequent to operation of the sub-circuit 16. In this trivial example, the AND-gate 11 as well as the Flip-Flop 12 may be replaced by a line of constant logic level "0" thereby reducing the number of state space variables in the mathematical model representative of the logic circuit 10.

Another example of useful reduction is the elimination of signals that are not in the so-called "cone of influence" of the circuit being verified. Thus, if only part of the circuit is being verified, then any other parts whose behavior does not alter the part under verification can be eliminated. Thus, in the example shown in FIG. 1, suppose that only that part of the logic circuit 10 which is connected to the ACK output 13 of the Flip-Flop 12 is being verified. In such case, not only can the AND-gate 11 and the Flip-Flop 12 be replaced by a line of constant logic level "0", but the sub-circuit 16 can be eliminated altogether. This follows since the sub-circuit 16 is not in the cone of logic being verified. This, of course, significantly reduces the complexity of the model being tested resulting in faster processing time and lower memory requirements.

However, it is not always convenient or possible to reduce the number of space state variables in such manner and even when manual reduction is feasible, it is only amenable to obvious or trivial reductions. Non-obvious reductions may still be possible and in this case conventional manual techniques do not succeed in optimal reduction. It would thus be desirable to offer a systematic approach to model reduction suitable for computer-implementation allowing non-obvious reductions to be achieved and thus achieving optimal reduction and maximum saving of computer resources.

SUMMARY OF THE INVENTION

This object is realized in accordance with the invention by means of a computer-implemented method for systematically eliminating redundant circuit elements in a state machine of a model having sequential circuit elements possessing one of a fixed number of possible states, said method comprising the steps of:

(a) sorting the sequential circuit elements into groups having an initial state which is determinate i.e. equal to a known one of said fixed number of possible states or which is indeterminate, (b) storing the state of each circuit element whose state is determinate, (c) for each circuit element whose state is determinate, calculating its next state, (d) moving each circuit element in (c) whose next state is different to the state thereof stored in (b) to the group of indeterminate circuit elements, (e) repeating steps (b) to (d) in respect of all remaining determinate circuit elements until no further circuit elements are moved in step (d), (f) replacing each of the remaining determinate circuit elements by a constant equal to its corresponding state, and (g) eliminating any circuit elements whose respective output is connected to one or more of the circuit elements replaced in (f) and to no other circuit elements.

Such a method is particularly applicable to the reduction of sequential circuit elements in a digital logic circuit having binary logic states "0" and "1" prior to design verification thereof. However, the method is equally applicable to state machines representative of non-binary circuits whose elements have one of a fixed number of possible states.

BRIEF DESCRIPTION OF THE DRAWINGS

In order to understand the invention and to see how it may be carried out in practice, a preferred embodiment will now be described, by way of non-limiting example only, with regard to model reduction of a binary logic circuit with reference to the accompanying drawings, in which.

DETAILED DESCRIPTION OF A PREFERRED EMBODIMENT

Figure 1:
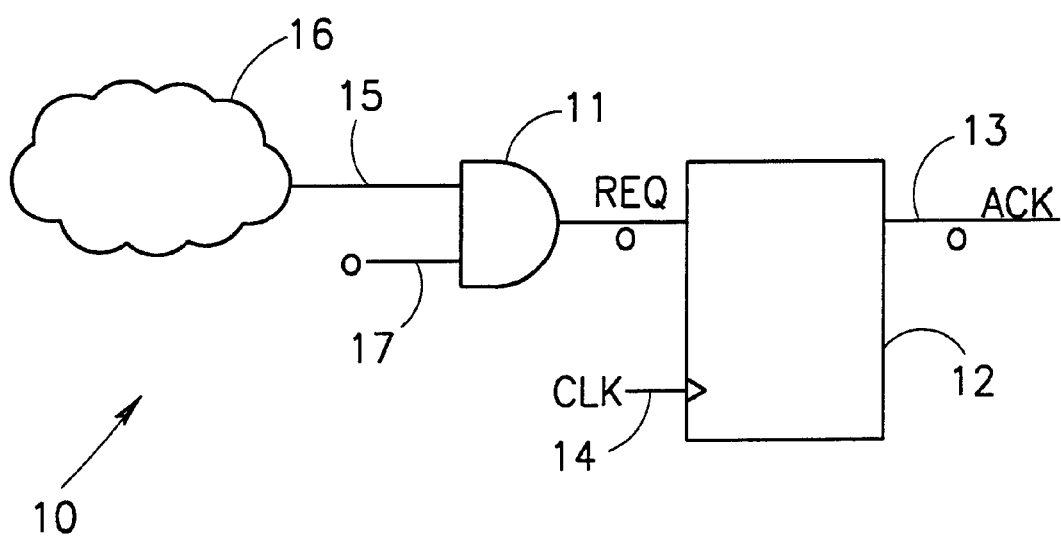
FIG. 1 shows part of a binary logic circuit for describing a prior art approach to model reduction.
Figure 2:
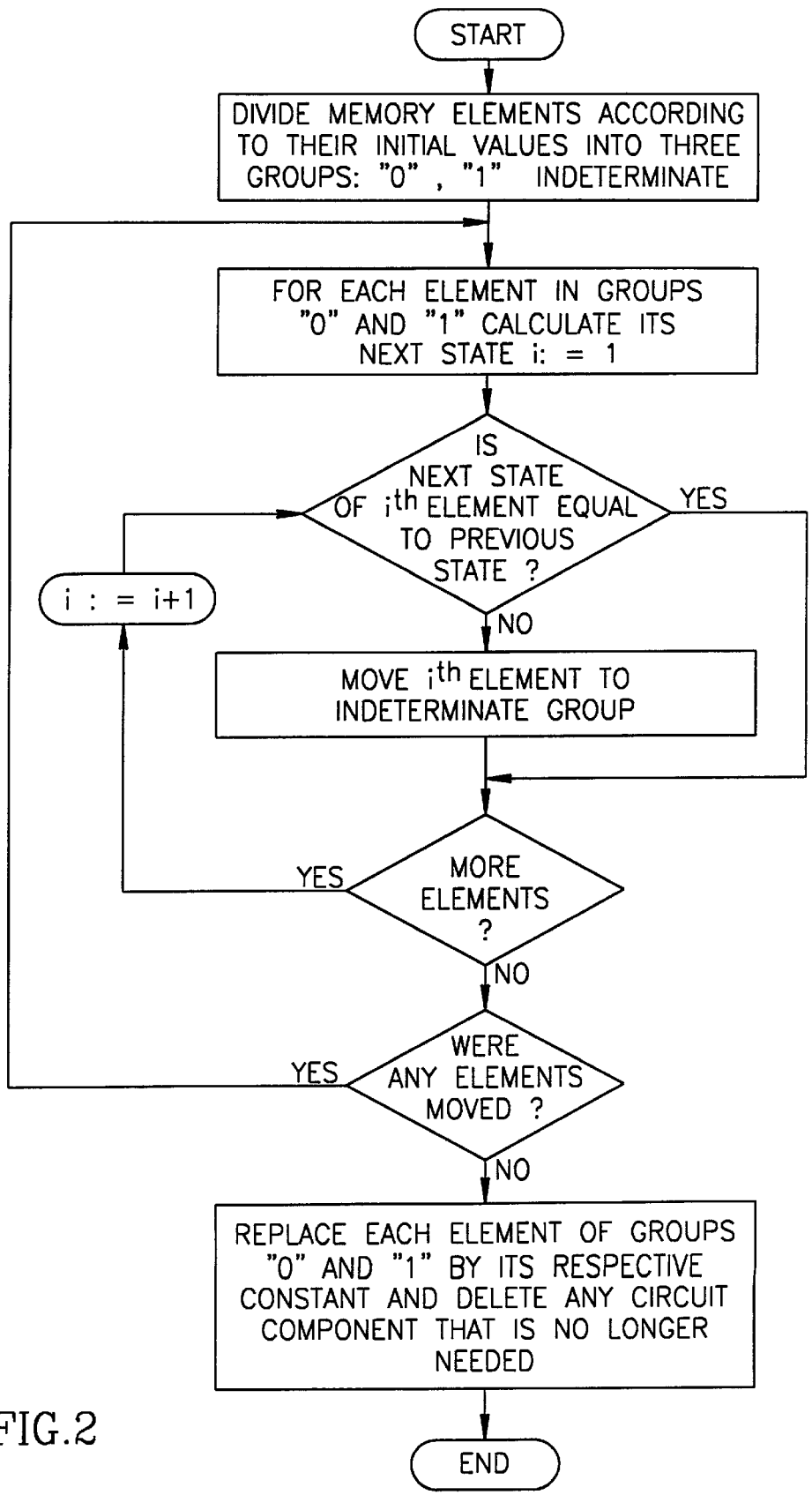
FIG. 2 is a flow diagram showing the principal steps in a method according to the invention for model reduction.

FIG. 2 is a flow diagram showing the principal operating steps associated with a method for systematically eliminating redundant circuit elements in a state machine of a model of a binary logic circuit. The binary logic circuit includes sequential circuit elements possessing one of two states (constituting a fixed number of possible states) i.e. "0" or "1". Initially, the sequential circuit elements are sorted into groups whose state is determinate i.e. equal to "0" or "1". The state of each circuit element whose state is determinate is stored in memory and its next state is calculated and compared with its preceding state. Each circuit element whose successive states are different is moved to the group of indeterminate circuit elements, and the cycle is repeated in respect of all remaining determinate circuit elements until no further circuit elements are moved. Each of the remaining determinate circuit elements is then replaced by a constant equal to its corresponding state i.e. "0" or "1". Finally, any circuit elements whose output is connected to one or more of the replaced circuit elements and to no other circuit elements is eliminated from the model.

By such means, redundant circuit elements, which in fact have no impact on the circuit's behavior, are eliminated and the model is reduced in complexity.

Figure 3:
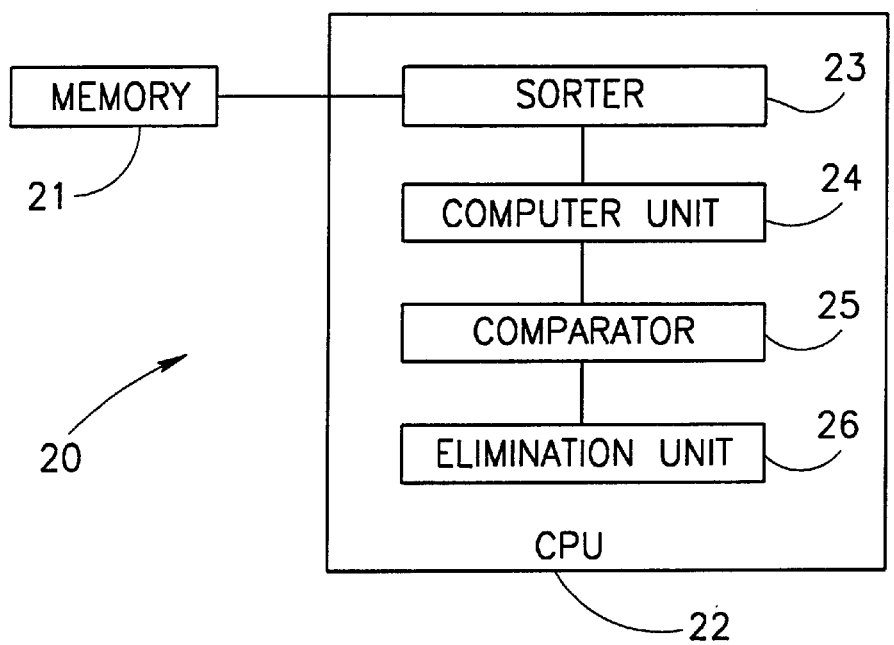
FIG. 3 is a block diagram showing functionally the principal components in a computer-operated system for carrying out the method shown in FIG. 2.

FIG. 3 shows functionally a system depicted generally as 20 for carrying out the model reduction described above with reference to FIG. 2 of the drawings. The system 20 comprises a memory 21 for storing a state machine of the model, and a CPU 22 (constituting a processing unit) coupled to the memory for removing redundancy from the model. The memory 21 and CPU 22 are preferably a suitably programmed computer although discrete circuit elements may, of course, be suitably connected. In such case, the CPU 22 must be replaced by the following functional components. A sorter 23 sorts the sequential circuit elements into groups whose initial state is determinate i.e. equal to "0" or "1" or is indeterminate. The CPU 22 stores in the memory 21 the state of each circuit element whose state is determinate. A computer unit 24 is coupled to the memory 21 and calculates the next state of each circuit element whose state is determinate. A comparator 25 compares successive states of each circuit element and removes any circuit element from the determinate group whose successive states are different. The CPU 22 is programmed to replace each of the remaining determinate circuit elements by a constant equal to its corresponding state. Finally, the CPU 22 includes an eliminating unit 26 for eliminating any circuit elements from the model whose respective output is connected to one or more of replaced the circuit elements and to no other circuit elements.

The above-described method can be expressed symbolically as follows. Consider n variables $x_1, x_2, \ldots x_n$, such that the initial value of each $x_i$ is a constant, $c_i$, and the next value of each $x_i$ is a function, $x'_i = f_i(x_1, x_2, \ldots x_n)$. Then if $(\forall i(x_i = c_i)) \Rightarrow (\forall i(x'_i = c_i))$, each $x_i$ can be replaced with $c_i$ while preserving the functionality of the circuit. The method is to assume that all state variables are constants, identical to their initial values. Then, one cycle is simulated and any flip-flop whose value has changed is dropped off the list. This is repeated until a fixed point is reached whereupon the remaining state variables are constants. The algorithm is as follows:

(a) Let $X_0$ be the set of all state variables with constant initial value. Let $j=0$.

(b) Calculate $X_{j+1}$ such that $x_i \in X_j$ and $f_i|_{x_k = c_k, \forall x_k \in X_j} = c_i$.

(c) If $X_{j+1} \subset X_j$, let $j = j+1$ and go to step (b), otherwise let $j = j+1$.

(d) The set of state variables $X_j$ are constants, such that for each $x_i \in X_j$, $x_i \equiv c_i$.

Figure 4:
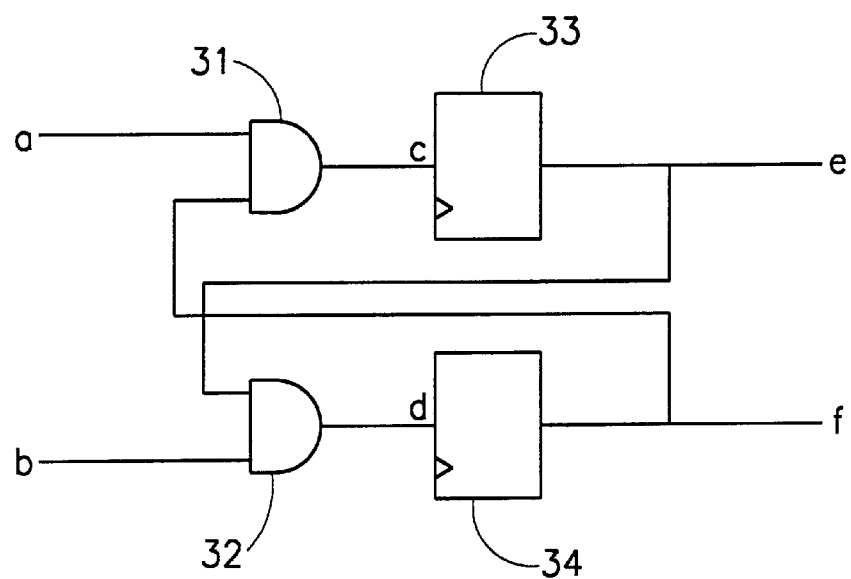
FIG. 4 shows part of a binary logic circuit amenable to reduction using the invention but not using prior art techniques.

It is not immediately obvious that this method finds more than simple constant propagation. However, FIG. 4 shows part of a logic circuit 30 that shows this is not the case. The logic circuit 30 comprises a pair of 2-input AND-gates 31 and 32 having respective first inputs a and b and whose outputs are fed to the REQ inputs c and d of respective Flip-Flops 33 and 34. The outputs of the Flip-Flops 33 and 34 are fed back to the respective second inputs of the AND-gates 32 and 31. Suppose that the initial values of signals e and f are both "0". Further suppose that neither signal a nor signal b has a constant value. Clearly, neither signal e nor signal f can be found to have a constant value by simple constant propagation, as each is a sequential function of the other. However, the method according to the invention as described will determine that both are constants and can be reduced out of the design. Thus the method according to the invention can be termed sequential constant propagation, as it finds variables which are sequentially constant, despite the fact that their inputs are functions.

The invention has been described with particular reference to a sequential logic circuit wherein an initial state of a Flip-Flop element or other logic element is known. However, even in the case where the initial state is indeterminate upon power-on, the method according to the invention can still be used to reduce the design if the state after reset is known. It is thus to be understood that in the context of the invention and the annexed claims, the term "initial state" is not to be construed only in respect of initial state upon power-on, but rather encompasses also the initial state after reset.

Finally, whilst the invention has been described by way of example with reference to Flip-Flops which have only two states, it will be understood that the invention is equally well applicable to logic circuit elements having multiple states. Such a circuit element can be expressed by the following logic using conventional programming structures:

var state: {idle, sending, waitack};

assign init(state):=idle;

next(state):=case state=idle: if req then sending else idle endif; state=sending: waitack; state=waitack:

if ack then idle else waitack endif;

where the input signal "req" is a constant 0.

The above statements represent a circuit element having three states: "idle", "sending" or "waitack" and whose next state is dependent on its current state according to the specified logic. Such a circuit element is translatable into Boolean logic which can be reduced using the method described above. However, the method can also be applied directly to the enumerated values.

What is claimed is:

1. A computer-implemented method for systematically eliminating redundant circuit elements in a state machine of a model having sequential circuit elements possessing one of a fixed number of possible state thereby reducing model complexity and rendering the state machine of the model solvable by a computer in a short calculation time than would be possible for the state machine including the redundant circuit elements, said method comprising the steps of:

(a) sorting the sequential circuit elements into groups having an initial state which is determinate i.e. equal to a known one of said fixed number of possible states or which is indeterminate, (b) storing the state of each circuit element whose is determinate, (c) for each circuit element whose state is determinate, calculating its next state, (d) moving each circuit element in (c) whose next state is different to the state thereof stored in (b) to the group of indeterminate circuit elements, (e) repeating steps (b) to (d) in respect of all remaining determinate circuit elements until no further circuit elements are moved in step (d), (f) replacing each of the remaining determinate circuit elements by a constant equal to its corresponding state, and (g) eliminating any circuit elements whose respective output is connected to one or more of the circuit elements replaced in (f) and to no other circuit elements.

2. The method according to claim 1, wherein the circuit elements are logic circuits having two possible logic states "0" and "1".

3. A system for systematically eliminating redundant circuit elements in a state machine of a model having sequential circuit elements possessing one of a fixed number of possible states thereby reducing model complexity and rendering the state machine of the model solvable by a computer in a shorter calculation time than would be possible for the state machine including the redundant circuit elements, said system comprising:

(a) a memory for storing the state machine of the model, and (b) a processing unit coupled to the memory for removing redundancy from the model;

(c) the processing unit including:

(i) a sorter for sorting the sequential circuit elements into groups having an initial state which is determinate i.e. equal to a known one of said fixed number of possible states or which is indeterminate, (ii) a storage unit storing in the memory the state of each circuit element whose state is determinate, (iii) a computer unit for calculating the next state of each circuit element whose state is determinate, (iv) a comparator unit for comparing successive states of each circuit element and for removing any circuit element from the detemate group whose successive states are different, (v) a substitution unit for replacing each of the remaining determinate circuit elements by a constant equal to its corresponding state, and (vi) an elimination unit for eliminating any circuit elements whose respective output is connected to one or more of the circuit elements replaced in (v) and to no other circuit elements.

* * * * *